United States Patent
Wu et al.

(10) Patent No.: US 7,473,459 B2
(45) Date of Patent: Jan. 6, 2009

(54) METHOD OF MANUFACTURING A FILM PRINTED CIRCUIT BOARD

(75) Inventors: Chia-Hui Wu, Hsinhua (TW); Pai-Sheng Cheng, Hsinhua (TW); Hung-Yi Wang, Hsinhua (TW)

(73) Assignee: Himax Technologies Limited (TW)

( * ) Notice: Subject to any disclaimer, the term of this patent is extended or adjusted under 35 U.S.C. 154(b) by 40 days.

(21) Appl. No.: 11/379,744

(22) Filed: Apr. 21, 2006

(65) Prior Publication Data
US 2006/0251873 A1 Nov. 9, 2006

(30) Foreign Application Priority Data
May 5, 2005 (TW) .............................. 94114561 A

(51) Int. Cl.
*B32B 3/00* (2006.01)
*H05K 1/09* (2006.01)
(52) U.S. Cl. .................. 428/209; 257/775; 174/257; 174/261
(58) Field of Classification Search ............... 428/209; 174/255, 257, 261; 257/775
See application file for complete search history.

(56) References Cited

U.S. PATENT DOCUMENTS

| | | | | |
|---|---|---|---|---|
| 4,786,576 A | * | 11/1988 | Bujese et al. ............ | 430/117.4 |
| 4,948,462 A | * | 8/1990 | Rossen ..................... | 438/16 |
| 5,458,763 A | * | 10/1995 | Kobayashi et al. ........ | 205/104 |
| 5,569,960 A | * | 10/1996 | Kumazawa et al. ........ | 257/738 |
| 5,701,055 A | * | 12/1997 | Nagayama et al. ........ | 313/504 |
| 5,779,926 A | * | 7/1998 | Ma et al. .................. | 216/67 |
| 6,605,519 B2 | * | 8/2003 | Lishan ..................... | 438/555 |
| 6,617,234 B2 | * | 9/2003 | Wang et al. ............... | 438/601 |
| 6,878,901 B2 | * | 4/2005 | Johnson et al. ........... | 219/121.69 |

FOREIGN PATENT DOCUMENTS

| | | |
|---|---|---|
| CN | 1343370 | 4/2002 |
| CN | 1490872 | 4/2004 |

* cited by examiner

*Primary Examiner*—Cathy Lam
(74) *Attorney, Agent, or Firm*—Hayes Soloway P.C.

(57) ABSTRACT

A method of manufacturing a film printed circuit board is provided. A film substrate consisting of a polyimide substrate, an alloy layer and a first copper layer is provided. A first lithographic and etching process is performed to pattern the copper layer and the alloy layer and a plurality of conductive line structures is formed on the polyimide substrate. A second copper layer is formed over the polyimide substrate and the conductive line structures. A second lithographic and etching process is performed to pattern the second copper layer.

5 Claims, 4 Drawing Sheets

METHOD OF MANUFACTURING A FILM PRINTED CIRCUIT BOARD

RELATED APPLICATIONS

The present application is based on, and claims priority from, Taiwan Application Serial Number 94114561, filed May 5, 2005, the disclosure of which is hereby incorporated by reference herein in its entirety.

BACKGROUND

1. Field of Invention

The present invention relates to a method of manufacturing a film printed circuit board, which is used in a chip on flex or chip on film process. More particularly, the present invention relates to a method of manufacturing a copper structure on a film printed circuit board, which is used in a chip on flex or chip on film process.

2. Description of Related Art

Driving integrated circuit (IC) packaging technology has evolved from a tape automatic bonding (TAB) process into a chip on flex or chip on film (COF) process. The driving force behind the evolution is the demand for increasingly smaller displays with higher dpi resolutions, while the sizes of the machines for which the displays are adapted are always decreasing.

The COF process makes a flip chip bond on a flexible or film printed circuit board. That is, to achieve the objective of being smaller, a driving IC and the electrical components are mounted on a film without the use of a traditional printed circuit. Thus, the COF process is usually employed to package a driving IC on a display panel.

Typically, a substrate of the film printed circuit board is made of polyimide (PI). An alloy layer is positioned on the substrate, and a copper metal layer is positioned on the alloy layer wherein the alloy layer is made of Ni—Cr alloy. A patterned photo resistant layer is formed on the copper metal layer by a lithography process, and then the copper metal layer, which is exposed, and the alloy layer under thereof are etched by a wet etching process. The wet etching process may employ a solution containing copper chloride, ferric ammine etc, as an etchant.

FIG. 1 is a sectional view of a conductive copper line formed by a traditional process. After the patterned photo resistant layer 106 is formed, the copper metal layer on the Pi substrate 100 is etched by the wet etching process to form a conductive copper line 104. A side effect of the wet etching process is that undercuts occur under the photo resistant layer 106, which makes the conductive copper line 104 to have a narrower top and a wider bottom. Generally, the thickness of the conductive copper line 104 is preferably between 6-12 μm, and the top width of the conductive copper line 104 should be more than half of the bottom width of the conductive copper line 104. If the top width of the copper line is too narrow, following processes, such as inner lead Au bump packaging and outer lead anisotropic conductive film (ACF) packaging processes, will be hard to perform. A way to increase the top width of the conductive copper line is to reduce the thickness of the conductive copper line, but if the thickness of the conductive copper line is too thin, the conductive copper line will be broken when the film printed circuit board is bent.

A solution to the problem mentioned above has been developed. FIG. 2A and FIG. 2B are schematic views of a traditional process for preventing the top width of the copper line from being too narrow. As illustrated in FIG. 2A, an alloy layer 202 and a copper metal layer 204 are positioned on a PI substrate 200 in order. A patterned photo resistant layer 206 is formed on the copper metal layer 204, and the patterned photo resistant layer 206 has openings 207. Another copper metal layer 208 is formed in the openings 207 by an electroplating process, and then, as illustrated in FIG. 2B, the patterned photo resistant layer 206 is removed, and thus the copper metal layer 208 protrudes from the copper metal layer 204.

As illustrated in FIG. 2C, the copper metal layer 208, copper metal layer 204 and alloy layer 202 are etched by a wet etching process until the PI substrate 200 is exposed. Parts of the copper metal layer 204, which are positioned in the opening 211 (illustrated in FIG. 2B), are completely removed and the other parts of the copper metal layer 204 which are positioned under the copper metal layer 208 partially remain. The side-walls of the conductive copper lines 210 have a recess caused by the wet etching process with the top width of the copper metal lines 210 maintained, a characteristic of isotropic etching.

The solution mentioned above seems effective but still has serious problems. As illustrated in FIG. 2A, the alloy layer 202 usually exists and is positioned under the copper metal layer 204, and the alloy layer 202 is typically made of Ni—Cr alloy. It is more difficult to etch Ni—Cr than copper when forming conductive copper lines 210 by the wet etching process. Thus, if the time of the wet etching process is not enough, the alloy layer 202, which is positioned between the conductive copper lines 210, will not be removed completely such that a micro-short problem will occur between the conductive copper lines 210; if the time of the wet etching process is increased to assure that the alloy layer 202, which is positioned between the conductive copper lines 210, can be removed completely, undercuts due to the over-etching the alloy layer 202 will occur under the conductive copper lines 210, such that the base of the conductive copper lines 210 will be weak. That is, although the solution mentioned above is able to improve the top width of the conductive lines, undercuts may still occur. Obviously, this solution cannot solve all problems related to manufacturing film printed circuit boards effectively.

SUMMARY

The shape of the conductive copper lines on the film substrate influences the following COF process. If the top widths of the conductive lines are too narrow, it will be difficult to fasten the conductive lines on the substrate; if the thickness of the conductive lines is too thick, the conductive copper line will be broken when the film printed circuit board is bent.

It is therefore an aspect of the present invention to provide a method of manufacturing a film printed circuit board, which is able to manufacture conductive lines with a required shape. The top widths and thicknesses of the conductive lines with the required shape are sufficient and prevent micro-short problems from occurring between the conductive lines.

In accordance with the foregoing and other aspects of the present invention, a method of manufacturing a film printed circuit board is provided. A film substrate consisting of a polyimide substrate, an alloy layer and a first metal layer are provided. A first lithographic and etching process is performed to pattern the first metal layer and the alloy layer, and a plurality of first conductive line structures is formed on the polyimide substrate. A second metal layer is formed over the polyimide substrate and the first conductive line structures. A second lithographic and etching process is performed to pattern the second metal layer. The first metal layer and the second metal layer may be made of copper.

In accordance with the foregoing and other aspects of the present invention, a film printed circuit board is provided. The film printed circuit board includes a film substrate and a conductive line positioned on the film substrate. The conductive line has a first metal conductive line structure and a second metal conductive line structure. The first metal conductive line structure is positioned on the film substrate, and the second metal conductive line structure is positioned on the first metal conductive line structure. The conductive line has concave side-walls. The first metal conductive line structure may comprise copper and Ni—Cr alloy, and the second metal conductive line structure may comprise copper. The film printed circuit board according to the present invention may be used to support a chip.

The method of manufacturing a film printed circuit board according to the present invention employs the first lithographic and etching process to define the width of the conductive lines; employs a copper electroplating process to form a copper metal layer for determining the thickness of the conductive lines; and finally employs the second lithographic and etching process to determine the top width of the conductive lines.

To perform the method of manufacturing a film printed circuit board according to the present invention, a film substrate is provided first, and an alloy layer and a first copper layer is positioned on the film substrate in order. The alloy layer may be made of Ni—Cr alloy. A first patterned photo resistant layer is formed on the first copper layer, and then the first wet etching process is performed to remove the first copper layer, which is exposed, and the alloy layer, which is positioned under the copper layer. Thus, conductive line structures, which are electrically insulated from each other are formed under the first patterned photo resistant layer.

Then, a second copper layer is formed over the film substrate. An electroplating process or a chemical plating process may be employed to form the second copper layer on a copper crystal seed layer positioned on the surface of the film substrate. The copper crystal seed layer may be formed by a physical vapor deposition process (PVD), eg. sputtering. After the second copper layer is formed, a second patterned photo resistant layer is formed on the second copper layer. The pattern of the second patterned photo resistant layer is the same as the pattern of the first patterned photo resistant layer. A second wet etching process is performed to pattern the second copper layer, and thus conductive lines, which are electrically insulated from each other, are formed under the second patterned photo resistant layer. Finally, the second patterned photo resistant layer is removed.

The patterned photo resistant layer may be formed by spin coating a photo resistant layer on the second copper layer or adhering a dry film photo resistant layer on the second copper layer first and then performing a lithography process for patterning the photo resistant layer.

According to one preferred embodiment of the present invention, the alloy layer, which is positioned between the two adjacent conductive lines, can be removed completely by the first lithography and etching process, which defines the width of the conductive lines. Because the second copper layer is able to compensate the first copper layer, which is removed by the first lithography and etching process, the problem of the top width of the conductive lines not being wide enough because of over etching the copper layer is no longer a concern in this step. The second copper layer is formed by the copper electroplating process to determine the thickness of the conductive lines and to compensate the top width of the first copper layer; finally, the top width of the conductive lines are defined by the second lithography and etching process.

The method of manufacturing a film printed circuit board according to the present invention solves the problem of narrow conductive line top widths experienced by contemporary manufacturing methods and maintains the thickness of the conductive lines. Furthermore, the method of manufacturing a film printed circuit board according the present invention does not only satisfy the design requirement of the conductive lines, but prevents the micro-short problem from occurring between the conductive lines because the alloy layer, positioned between two adjacent conductive lines, is removed completely.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Reference will now be made in detail to the method of manufacturing a film printed circuit board according to the present invention. How to form conductive copper lines, which have a proper top width, on a film printed circuit board will be illustrated in the present embodiment of the invention.

Figure 1:
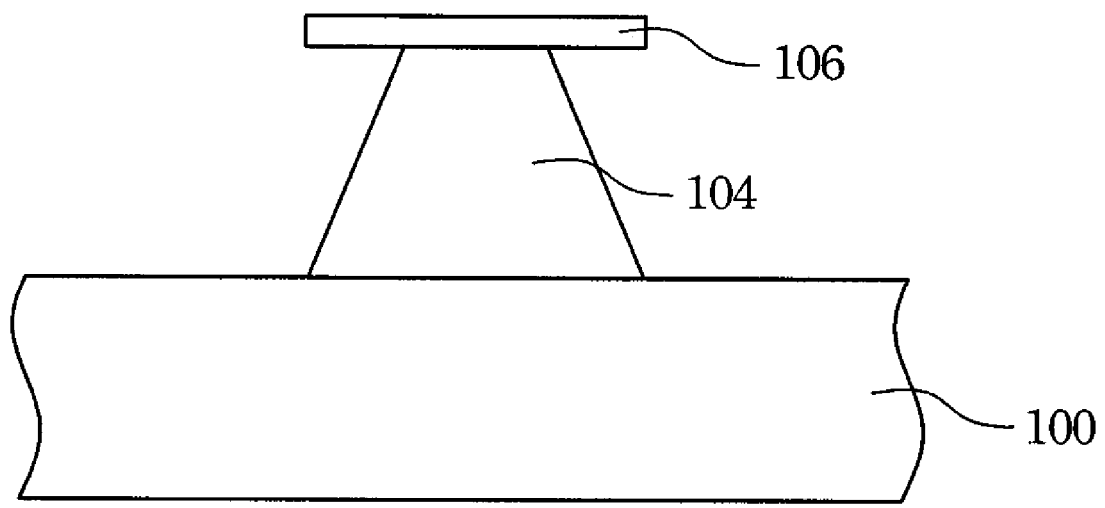
FIG. 1 is a sectional view of a conductive copper line formed by a traditional process.
Figure 2A:
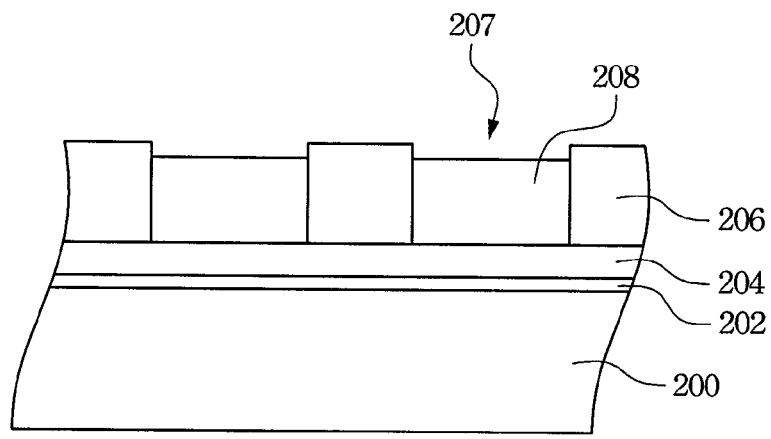
FIGS. 2A-2C are schematic views of a traditional process for preventing the top width of the copper line from being too narrow.
Figure 2B:
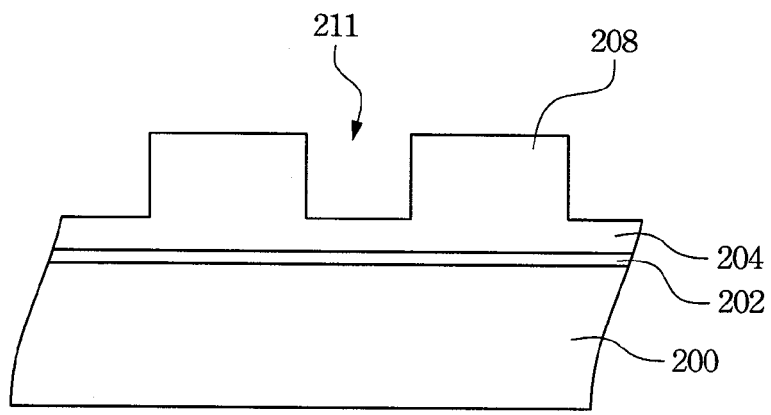
Figure 2C:
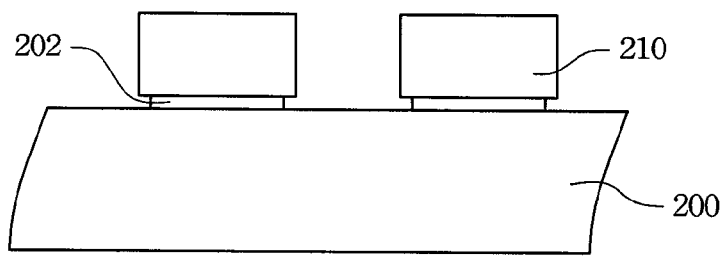
Figure 3A:
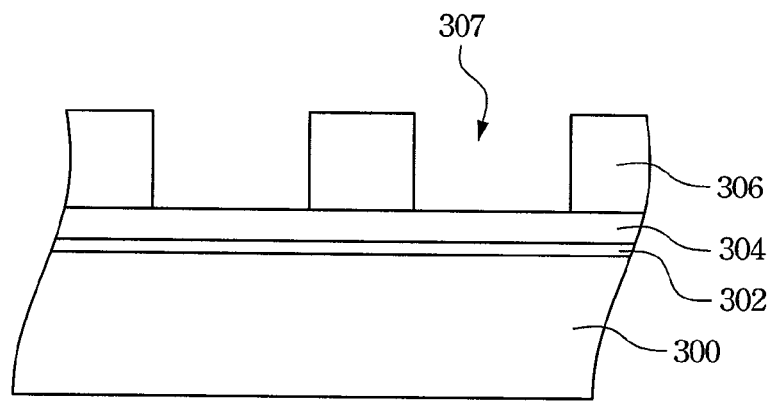
FIGS. 3A-3E are sectional views illustrating the method of manufacturing a film printed circuit board according to one preferred embodiment of the present invention.
Figure 3B:
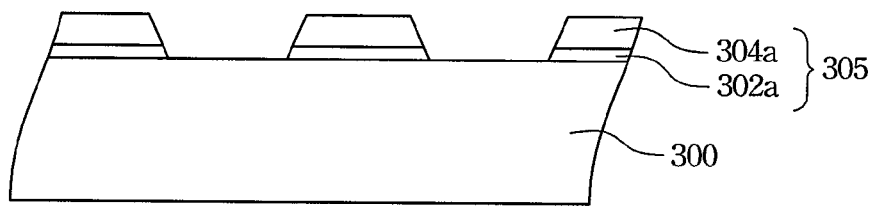

FIGS. 3A-3E are sectional views illustrating the method of manufacturing a film printed circuit board according to one preferred embodiment of the invention. Reference is made to FIG. 3A. An alloy layer 302 and a copper layer 304 are formed on a PI substrate 300 in order. The alloy layer 302 may be made of Ni—Cr alloy. A copper crystal seed layer (not shown) may be formed between the copper layer 304 and the alloy layer 302. A patterned photo resistant layer 306 is formed on the copper layer 304, and the patterned photo resistant layer 306 has openings 307. The copper layer 304, which is exposed by the openings 307, and the alloy layer 302, which is positioned under the openings 307, are etched by a wet etching process which employs the patterned photo resistant layer 306 as a mask. The wet etching process may also employ a solution containing copper chloride and ferric ammine etc as an etchant. The patterned photo resistant layer 306 may be formed by spin coating a photo resistant layer on the copper layer 304 or adhering a dry film photo resistant layer on the copper layer 304 first and then performing a lithography process for patterning the photo resistant layer. After the wet etching process is performed, conductive line structures 305 consisting of the copper layer 304a and the alloy layer 302a as shown in FIG. 3B can be obtained.

Figure 3C:
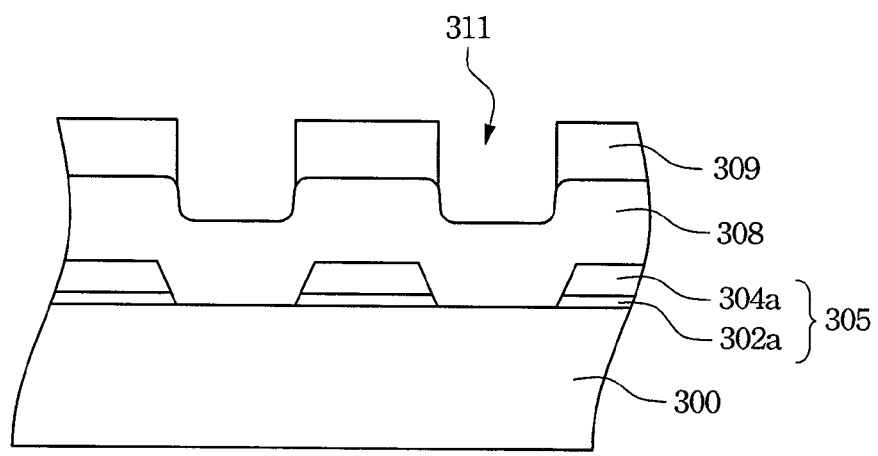

As shown in FIG. 3C, another copper layer 308 is formed on the conductive line structures. The Pi substrate 300 and the conductive line structures 305 may be covered with a copper crystal seed layer by a physical vapor deposition process (PVD), ex. sputtering. Then an electroplating process or an electroless plating process may be used to form the copper layer 308.

Reference is made to FIG. 3C, again. A patterned photo resistant layer 309 is formed on the copper layer 308. The patterned photo resistant layer 309 has openings 311. The openings 311 expose a region between two adjacent conductive line structures 305. Then, a wet etching process is performed. The wet etching process may also employ a solution containing copper chloride and ferric ammine etc as an etchant. Detailed steps for forming the patterned photo resistant layer 309 are the same as the detailed steps for forming the patterned photo resistant layer 306 which has been described above.

Figure 3D:
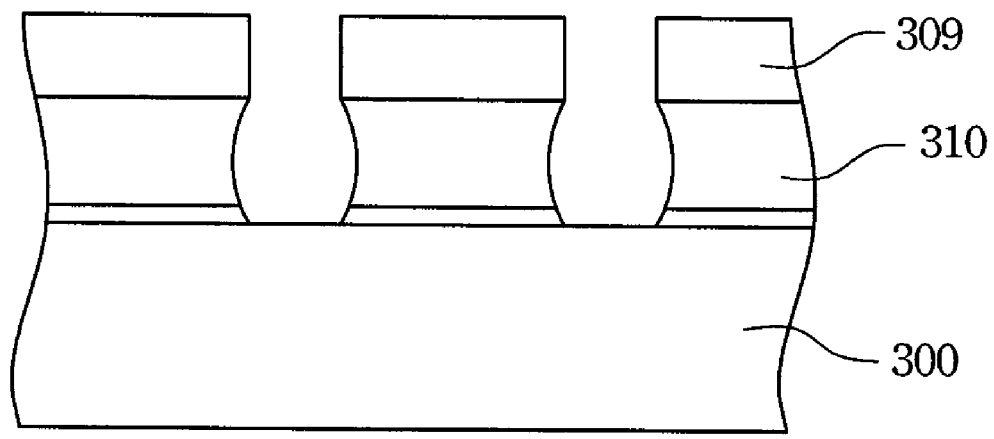

As shown in FIG. 3D, the copper layer 308, which is not covered by the patterned photo resistant layer 309, is etched until the PI substrate 300 is exposed by the wet etching process, after which conductive copper line structures 310 that are covered with the patterned photo resistant layer 309 are formed. The conductive copper line structures 310 consists of a copper layer 304a and a copper layer 308 (as shown in FIG. 3C) which have been etched. The conductive copper line structures 310 are shaped with a narrower middle and wider top and bottom because the wet etching process isotropic etching characteristics, and the copper layer 308 is covered with the patterned photo resistant layer 309 (shown in FIG. 3C). Basically, the conductive copper line structures 310 have concave side-walls.

Figure 3E:
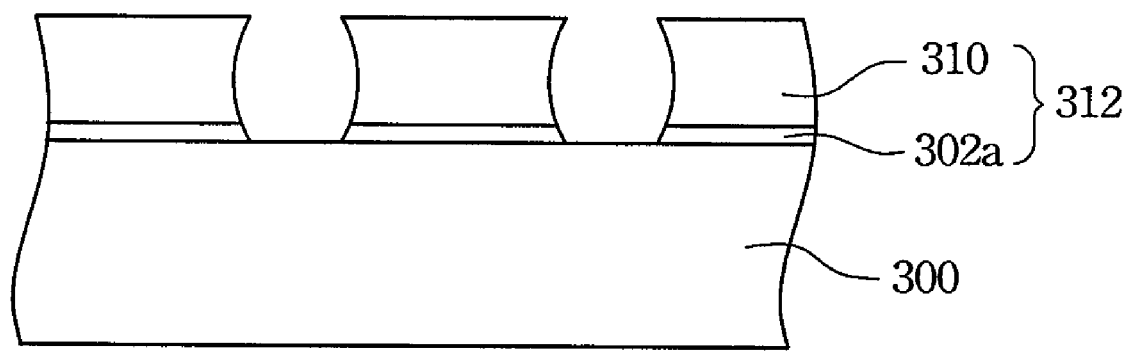

As shown in FIG. 3E, after the patterned photo resistant layer 309 is removed, conductive lines 312 consisting of the conductive copper line structures 310 and the alloy layer 302a under thereof are provided. The side-walls of the conductive lines 312 have a concave shape because the wet etching process isotropic etching characteristics. The top width of the conductive lines 312 can be maintained because the pattern of the photo resistant layer 309 (shown in FIG. 3D). The conductive lines 312 have the characteristics of concave side-walls with a sufficiently thickness and top width.

The method of manufacturing a film printed circuit board according to the present invention can remove the alloy layer 302, which is exposed, completely by over etching when forming the conductive line structures. Thus, a micro-short problem can be prevented from occurring between the conductive lines and the top width of the conductive lines need not be considered in this step.

Then, the copper layer 308 which is formed by the electroplating process shown in FIG. 3C is able to compensate the lost top width and thickness of conductive line structures 305. The lost top width and thickness of conductive line structures 305 are due to over etch the conductive line structures 305.

Materials which are etched by the wet etching process to form the conductive lines 312 (shown in FIG. 3E) are copper, and the alloy layer need not to be over etched in this step.

Thus, the dual problems of narrow conductive line top widths and undercutting experienced by contemporary manufacturing methods are solved.

According to one preferred embodiment of the present invention, the widths of the conductive lines are defined by the first lithography and etching process; the thickness of the conductive lines are determined by the copper layer formed by the electroplating process; finally, the top widths of the conductive lines are defined by the second lithography and etching process. The method of manufacturing a film printed circuit board disclosed in this invention is able to manufacture the conductive lines with the required shape, that is, that top widths and thicknesses of the conductive lines are sufficient. Furthermore, the method of manufacturing a film printed circuit board according to the present invention does not only satisfy the design requirement of the conductive lines, but prevents the micro-short problem from occurring between the conductive lines because the alloy layer, positioned between two adjacent conductive lines, is removed completely.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A film printed circuit board, comprising:
   a film substrate; and
   a conductive line positioned on the film substrate the conductive line comprising:
      a first metal conductive line structure positioned on the film substrate; and
      a second metal conductive line structure positioned on the first metal conductive line structure;
      wherein the conductive line has concave side-walls.

2. The film printed circuit board as claimed in claim 1, wherein the first metal conductive line structure comprises copper.

3. The film printed circuit board as claimed in claim 1, wherein the second metal conductive line structure comprises copper.

4. The film printed circuit board as claimed in claim 1, wherein the first metal conductive line structure comprises Ni—Cr alloy.

5. The film printed circuit board as claimed in claim 1, wherein the film printed circuit board is used for supporting a chip.

* * * * *